United States Patent
Foltyn et al.

(10) Patent No.: US 7,736,761 B2
(45) Date of Patent: Jun. 15, 2010

(54) BUFFER LAYER FOR THIN FILM STRUCTURES

(75) Inventors: Stephen R. Foltyn, Los Alamos, NM (US); Quanxi Jia, Los Alamos, NM (US); Paul N. Arendt, Los Alamos, NM (US); Haiyan Wang, Los Alamos, NM (US)

(73) Assignee: Los Alamos National Security, LLC, Los Alamos, NM (US)

( * ) Notice: Subject to any disclaimer, the term of this patent is extended or adjusted under 35 U.S.C. 154(b) by 182 days.

(21) Appl. No.: 11/591,269

(22) Filed: Oct. 31, 2006

(65) Prior Publication Data

US 2010/0093547 A1     Apr. 15, 2010

Related U.S. Application Data

(62) Division of application No. 10/624,855, filed on Jul. 21, 2003, now Pat. No. 7,129,196.

(51) Int. Cl.
*B32B 9/00*   (2006.01)

(52) U.S. Cl. ............... 428/701; 428/702; 428/930; 505/237; 505/238; 174/125.1

(58) Field of Classification Search ............ 505/230, 505/237, 238; 428/699–702, 930; 174/125.1; 427/62
See application file for complete search history.

(56) References Cited

U.S. PATENT DOCUMENTS

| 6,410,487 | B1 * | 6/2002 | Miller et al. | 505/239 |
| 6,716,545 | B1 * | 4/2004 | Holesinger et al. | 428/701 |
| 6,756,139 | B2 * | 6/2004 | Jia et al. | 428/701 |
| 6,800,591 | B2 * | 10/2004 | Jia et al. | 505/237 |
| 6,921,741 | B2 * | 7/2005 | Arendt et al. | 505/239 |

FOREIGN PATENT DOCUMENTS

WO     WO 03/021656     *  3/2003

* cited by examiner

*Primary Examiner*—Steven Bos
*Assistant Examiner*—Paul A Wartalowicz
(74) *Attorney, Agent, or Firm*—Bruce H. Cottrell; Juliet A. Jones

(57) ABSTRACT

A composite structure including a base substrate and a layer of a mixture of strontium titanate and strontium ruthenate is provided. A superconducting article can include a composite structure including an outermost layer of magnesium oxide, a buffer layer of strontium titanate or a mixture of strontium titanate and strontium ruthenate and a top-layer of a superconducting material such as YBCO upon the buffer layer.

12 Claims, 2 Drawing Sheets

BUFFER LAYER FOR THIN FILM STRUCTURES

RELATED APPLICATIONS

This application is a divisional of patent application Ser. No. 10/624,855 filed, Jul. 21, 2003 now U.S. Pat. No. 7,129,196 issued Oct. 31, 2006.

STATEMENT REGARDING FEDERAL RIGHTS

This invention was made with government support under Contract No. DE-AC52-06NA25396 awarded by the U.S. Department of Energy. The government has certain rights in the invention.

FIELD OF THE INVENTION

The present invention relates to a buffer layer for thin film structures. Among such thin film structures are included superconducting structures, ferroelectric structures, photovoltaic structures and others. The superconducting structures are those based upon $YBa_2Cu_3O_7$ (YBCO) as the superconducter with a substrate of, e.g., single crystal substrates such as lanthanum aluminum oxide, aluminum oxide, magnesium oxide and the like, and polycrystalline substrates such as nickel-based alloys. The buffer layer is employed as a layer upon selected substrates. In the superconducting structures commonly referred to as coated conductors, the buffer layer is employed between and a YBCO superconducting layer and a base metal substrate having a magnesium oxide coated substrate, the magnesium oxide layer deposited in an ion beam assisted deposition. For example, high temperature superconducting films of YBCO can be grown epitaxially on epitaxial structures including the present buffer layer and provide high $J_c$'s and $I_c$'s.

BACKGROUND OF THE INVENTION

The preparation of oriented layers of crystallographically materials is critical in a number of technical areas. For example, high temperature superconductors often employ epitaxially oriented layers of, e.g., YBCO to achieve desired properties. Similarly, epitaxially oriented films such as conductive oxides, ferroelectric, ferromagnetic, piezoelectric, insulating, and semiconductive materials are desired in the areas of microelectric and opto-electric devices. To achieve the desired crystallographic orientation, e.g., epitaxial orientation, of materials such as YBCO, $SrRuO_3$, PZT, $Ba_{1-x}Sr_x$-$TiO_3$, $La_{0.7}Sr_{0.3}MnO_3$, and Si, extensive work has focused on the underlying structure or substrate onto which the oriented layers are deposited.

Stronium ruthenate ($SrRuO_3$ or SRO) is a conductive metal oxide material and it has been used as an electrode in ferroelectric capacitor applications. Epitaxial $SrRuO_3$ thin films have been previously deposited upon strontium titanate ($SrTiO_3$ or STO) substrates (see, Chen et al., "Epitaxial $SrRuO_3$ thin films on (001) $SrTiO_3$," Appl. Phys. Lett., 71 1047 (1997). Strontium titanate is a dielectric oxide and has been previously described as a suitable base substrate, e.g., in U.S. Pat. No. 6,541,136. Stronium titanate has also been previously described as a buffer material in superconductive structures, e.g., in U.S. Pat. No. 6,562,761 wherein strontium titanate is suggested as a buffer layer on selected metal substrates and selected single crystal substrates, and in other microelectronic structures, e.g., in U.S. Pat. No. 5,471,364 wherein strontium titanate is suggested as a buffer layer having a moderate dielectric constant.

Despite the many prior uses of both stronium ruthenate and stronium titanate, the use of stronium titanate alone or the use of a mixture of stronium ruthenate and stronium titanate as a buffer layer has not been previously described upon an IBAD-magnesium oxide layer in a coated conductor superconducting structure. Additionally, the use of a mixture of stronium ruthenate and stronium titanate as a buffer layer has not been previously described as a layer in other electronic applications such as ferroelectric, ferromagnetic, piezoelectric and the like.

It is an object of the present invention to provide composite structures including a buffer layer of strontium titanate or a mixture of strontium titanate and strontium ruthenate ($SrTi_xRu_{1-x}O_3$ where $0<x\leq1$) directly on a magnesium oxide interlayer where the buffer layer is suitable for subsequent growth of a thin film layer, e.g., a superconducting layer, thereon.

It is another object of the present invention to provide composite structures including a buffer layer of a mixture of strontium titanate and strontium ruthenate ($SrTi_xRu_{1-x}O_3$ where $0<x<1$) where the buffer layer is suitable for subsequent growth of a thin film layer thereon.

SUMMARY OF THE INVENTION

To achieve the foregoing and other objects, and in accordance with the purposes of the present invention, as embodied and broadly described herein, the present invention provides a composite structure including a base substrate, and a buffer layer of $SrTi_xRu_{1-x}O_3$ where $0<x<1$ thereon the base substrate. Such a composite structure can serve as a support for deposition of subsequent high quality epitaxial thin film layers thereon. Such thin film layers can be of materials such as high temperature superconducting materials, e.g., YBCO and the like, such as ferroelectric materials, e.g., barium strontium titanate, strontium bismuth tantalate and the like, such as ferromagnetic materials, e.g., lanthanum strontium manganate, lanthanum calcium manganate and the like, such as piezoelectric materials, e.g., lead zirconium titanate and the like, and other such materials, e.g., yttrium manganate, bismuth ferrite or bismuth manganate.

In one embodiment, the present invention provides a composite structure including a base metallic substrate having a layer of magnesium oxide thereon, and a buffer layer of $SrTi_xRu_{1-x}O_3$ where $0<x\leq1$ thereon the layer of magnesium oxide. In a preferred embodiment, the magnesium oxide layer is deposited by ion-beam-assisted deposition. Such a composite structure can serve as a support for deposition of subsequent high quality epitaxial thin film layers of high temperature superconducting materials.

DETAILED DESCRIPTION

Figure 1:
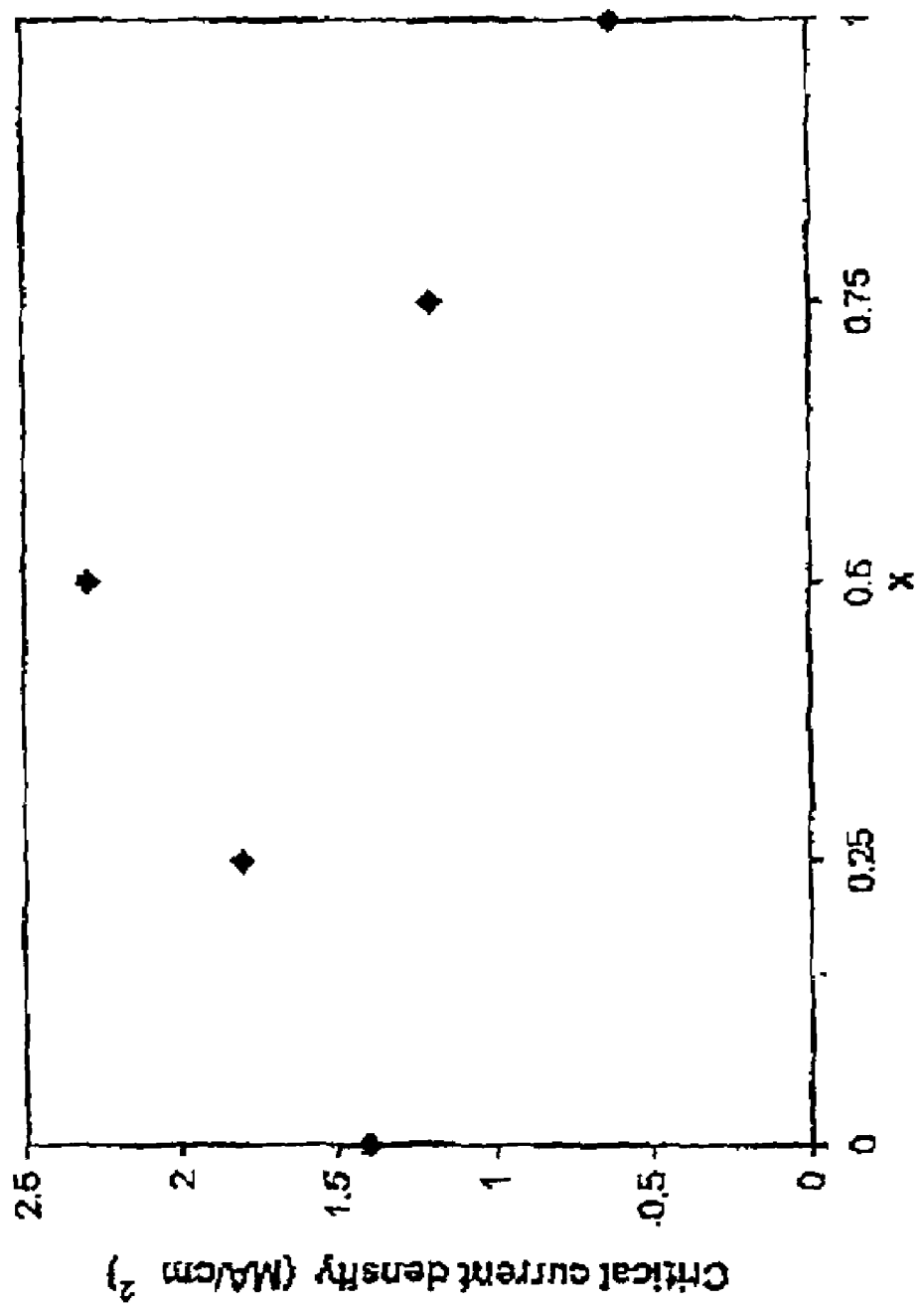
FIG. 1 shows a graph plotting critical current density (in $MA/cm^2$) for 1.5 micron thick YBCO coatings upon various $SrTi_xRu_{1-x}O_3$ where $0<x\leq1$ buffer layers in accordance with the present invention.

The present invention is concerned with buffer layers of $SrTi_xRu_{1-x}O_3$ where $0<x<1$ for subsequent deposition of thin film materials and composite structures for subsequent growth of thin film layers thereon. The present invention is further concerned with composite structures including a buffer layer of $SrTi_xRu_{1-x}O_3$ where $0<x\leq1$ on a base metllic substrate including a layer of magnesium oxide thereon. These composite structures can be subsequently coated with superconducting materials, e.g., YBCO, as an epitaxial thin film material so as to form superconducting articles. High temperature superconducting films can be grown epitaxially on such composite structures and yield high $J_c$'s and $I_c$'s. Such high temperature superconducting films can be prepared in the form of wires or tapes.

In the present invention, an initial or base substrate can be any polycrystalline material such as polycrystalline metals or polycrystalline ceramics or can be a single crystal base substrate such as lanthanum aluminum oxide, aluminum oxide, magnesium oxide and the like. Also, the initial or base substrate can be an amorphous substrate such as silica or glass. In one embodiment, the base substrate can be a polycrystalline metal such as metal alloys. Nickel-based alloys such as various Hastelloy metals, Haynes metals and Inconel metals are useful as the base substrate. Iron-based substrates such as steels and stainless steels may be used as the base substrate. Copper-based substrates such as copper-beryllium alloys may also be useful as the base substrate. In one embodiment, the base substrate can be a polycrystalline ceramic such as polycrystalline aluminum oxide, polycrystalline yttria-stabilized zirconia (YSZ), forsterite, yttrium-iron-garnet (YIG), silica and the like.

The ultimate application can determine the selection of the material for the base substrate. For example, the selection of the base substrate on which subsequent superconducting material (e.g., YBCO) is deposited can allow for the resultant article to be flexible whereby superconducting articles (e.g., coils, motors or magnets) can be shaped. Thus, for superconducting applications requiring flexible substrates, the base substrate is a polycrystalline metal as these materials are generally flexible, i.e., they can be shaped. For other applications, the base substrate on which other oriented materials are deposited may be polycrystalline ceramics, either flexible or non-flexible. For still other applications, the base substrate may be a single crystal substrate such as magnesium oxide, lanthanum aluminate, or aluminum oxide.

Some base substrates can include a layer of a metal oxide or metal oxynitride material deposited upon an underlying substrate material. Such layers can be crystalline or amorphous. By "crystalline" is meant that the atoms of the material have order over various length scales of longer than a few nanometers. By "order" is meant that the atoms have a definite pattern referred to as a lattice structure.

In some instances, the base substrate can include an oriented cubic oxide layer of, e.g., MgO, preferably deposited by ion-beam-assisted deposition (IBAD) over one or more underlying materials. For example, a metal oxide or metal oxynitride material layer can be deposited on an underlying material including a nickel based alloy coated with a first layer of aluminum oxide and a next layer of yttrium oxide, the depositions carried out by pulsed laser deposition, e-beam evaporation, sputtering or by any other suitable means. Such a metal oxide or metal oxynitride material layer is generally deposited at temperatures of generally about 100° C. Such a metal oxide or metal oxynitride material layer is typically from about 50 angstroms to about 1000 angstroms in thickness, preferably from about 50 angstroms to about 200 angstroms. Among the metal oxide or metal oxynitride materials suitable as the layer are included yttrium oxide ($Y_2O_3$), aluminum oxynitride (AlON), erbium oxide ($Er_2O_3$), yttria-stabilized zirconia (YSZ), cerium oxide ($CeO_2$), europium oxide, nickel aluminate spinel ($NiAl_2O_4$), and barium zirconate ($BaZrO_3$). Preferably, the layer of metal oxide or metal oxynitride material is yttrium oxide, aluminum oxynitride, erbium oxide or yttria-stabilized zirconia and more preferably is yttrium oxide or erbium oxide.

In some instances, an underlying substrate material can include a first coating layer, i.e., an inert oxide material layer, upon the underlying substrate material which is polished thereafter so as to have the desired smoothness for subsequent depositions. Such an inert oxide material layer can also serve as a barrier layer to reduce or eliminate migration of ions from the base substrate, particularly from polycrystalline metal substrates, to other layers.

By "inert" is meant that a material does not react, or has negligible reaction, with other material within the base substrate or with any subsequently deposited materials. Examples of suitable inert oxide materials include aluminum oxide ($Al_2O_3$), erbium oxide ($Er_2O_3$), yttrium oxide ($Y_2O_3$), and yttria-stabilized zirconia (YSZ). A preferred inert oxide material is aluminum oxide. Such an inert oxide layer can be deposited on the base substrate by pulsed laser deposition, e-beam evaporation, sputtering or by any other suitable means. Such a layer is generally deposited at about room temperature.

In another embodiment of the invention, a single layer of erbium oxide is used as both an inert layer and a nucleation layer. With the use of erbium oxide as the crystalline layer onto which the MgO is deposited, there is generally no need to consider any other inert oxide layer upon the base substrate. Such a crystalline erbium oxide layer can be chemically mechanically polished if desired.

Among oriented cubic oxide materials that can be included within the base substrate structure can be included, e.g., magnesium oxide, calcium oxide, strontium oxide, zirconium oxide, barium oxide, europium oxide, samarium oxide and other materials such as described in U.S. Pat. No. 6,190,752 by Do et al. Preferably, the layer of oriented cubic oxide material having a rock-salt-like structure is a magnesium oxide layer. Such a MgO layer is preferably deposited by electron beam evaporation with an ion beam assist. The MgO layer in the ion-beam-assisted deposition is typically sputtered from a magnesiun oxide target. An ion-assisted, electron-beam evaporation system similar to that described by Wang et al., App. Phys. Lett., vol. 71, no. 20, pp. 2955-2957 (1997), can be used to deposit such a MgO film. Alternatively, a dual-ion-beam sputtering system similar to that described by Iijima et al., IEEE Trans. Appl. Super., vol. 3, no. 1, pp. 1510 (1993), can be used to deposit such a MgO film. Generally, the substrate normal to ion-assist beam angle is 45±3°.

An additional thin homo-epitaxial layer of MgO can be optionally deposited as a layer on some base substrates, especially those including an IBAD layer of magnesium oxide. Such an additional thin homo-epitaxial layer of MgO can be deposited by a process such as electron beam or magnetron sputter deposition. This thin homo-epitaxial layer can generally be about 50 angstroms to 1000 angstroms, prefereably 100 angstroms to 500 angstroms in thickness.

As some base substrates can have a rough surface, such surfaces can be mechanically polished, electrochemically polished or chemically mechanically polished to provide a smoother surface for optimization of properties in subsequently deposited layers. Electrochemical polishing of metallic substrates in an acid bath as described by Kreiskott et al., Supercond. Sci. Technol., vol. 16, pp. 613-616 (2003), is generally preferred.

In one embodiment of the present invention, the high temperature superconducting (HTS) material is generally YBCO, e.g., $YBa_2Cu_3O_{7-\delta}$, $Y_2Ba_4Cu_7O_{14+x}$, or $YBa_2Cu_4O_8$, although other minor variations of this basic superconducting material, such as use of other rare earth metals as a substitute for some or all of the yttrium, may also be used. A mixture of the rare earth metal europium with yttrium may be one preferred combination. Other superconducting materials such as bismuth and thallium based superconductor materials may also be employed. $YBa_2Cu_3O_{7-\delta}$ is generally preferred as the superconducting material.

A high temperature superconducting (HTS) layer, e.g., a YBCO layer, can be deposited, e.g., by pulsed laser deposition or by methods such as evaporation including coevaporation, e-beam evaporation and activated reactive evaporation, sputtering including magnetron sputtering, ion beam sputtering and ion assisted sputtering, cathodic arc deposition, chemical vapor deposition, organometallic chemical vapor deposition, plasma enhanced chemical vapor deposition, molecular beam epitaxy, a sol-gel process, liquid phase epitaxy and the like.

The composite structure provided in accordance with the present invention includes a base substrate and a layer of a mixture of strontium titanate and strontium ruthenate. Such a composite structure is useful for subsequent deposition of thin film layers of, e.g., YBCO. Optionally, other thin films can be deposited from a material selected from the group consisting of superconductors, including high temperature superconductors, semiconductors, photovoltaic materials, magnetic materials, ferroelectric materials, ferromagnetic materials, piezoelectric materials, insulating materials, conductive materials and precursors of superconductors or high temperature superconductors. The composite structure is especially preferred for subsequent deposition of high temperature superconductor materials.

Optionally within the present invention, one or more buffer layers can be deposited so that they are between the composite structure (i.e., the base substrate and the layer of a mixture of strontium titanate and strontium ruthenate) and any subsequent high temperature superconducting layer such as YBCO. The buffer layers can provide assistance in lattice matching. Such so-called "buffer layers" should have good "structural compatibility" between the layer of strontium titanate or the layer of a mixture of strontium titanate and strontium ruthenate and subsequently deposited superconducting materials, e.g., YBCO, and should have good chemical compatibility with adjacent layers. By "chemical compatibility" is meant that the buffer layer does not undergo property-degrading chemical interactions, or has minimal interactions if at all, with the adjacent layers. By "structural compatibility" is meant that the buffer layer has a substantially similar lattice structure with any subsequently deposited material, e.g., superconductive material.

In one embodiment of the present invention, where the base substrate includes a magnesium oxide layer thereon, preferably such a magnesium oxide layer deposited by IBAD, the buffer layer is $SrTi_xRu_{1-x}O_3$ where $0<x\leq1$, i.e., the buffer layer can be a mixture of strontium titanate and strontium ruthenate or can be strontium titanate alone. In general, where mixtureds of strontium titanate and strontium ruthenate are used, the mixture can include a wide range of ratios. In one set of experiments, $SrTi_xRu_{1-x}O_3$ where x is 0.5, was found to provide the highest critical current density ($J_c$) for a high temperature superconducting film of YBCO. The buffer layer of $SrTi_xRu_{1-x}O_3$ where $0<x\leq1$ is generally from about 200 angstroms to about 1500 angstroms in thickness, preferably from about 400 angstroms to about 600 angstroms in thickness. These buffer layers are generally deposited at temperatures of greater than about 600° C., preferably at temperatures of from about 650° C. to about 850° C. For $SrTi_xRu_{1-x}O_3$ where x=1, deposition temperatures of between about 800° C. and 825° C. have been found preferably for a base metallic substrate including a magnesium oxide layer deposited by IBAD thereon.

In pulsed laser deposition, powder of the material to be deposited can be initially pressed into a disk or pellet under high pressure, generally above about 1000 pounds per square inch (PSI) and the pressed disk then sintered in an oxygen atmosphere or an oxygen-containing atmosphere at temperatures of about 950° C. for at least about 1 hour, preferably from about 12 to about 24 hours. An apparatus suitable for pulsed laser deposition is shown in Appl. Phys. Lett. 56, 578 (1990), "Effects of Beam Parameters on Excimer Laser Deposition of $YBa_2Cu_3O_{7-\delta}$", such description hereby incorporated by reference.

Suitable conditions for pulsed laser deposition include, e.g., the laser, such as an excimer laser (20 nanoseconds (ns), 248 or 308 nanometers (nm)), targeted upon a rotating pellet of the target material at an incident angle of about 45°. The substrate can be mounted upon a heated holder rotated at about 0.5 rpm to minimize thickness variations in the resultant film or coating, The substrate can be heated during deposition at temperatures from about 600° C. to about 950° C., preferably from about 700° C. to about 850° C. An oxygen atmosphere of from about 0.1 millitorr (mTorr) to about 500 mTorr, preferably from about 100 mTorr to about 400 mTorr, can be maintained within the deposition chamber during the deposition. Distance between the substrate and the pellet can be from about 4 centimeters (cm) to about 10 cm.

The deposition rate of the film can be varied from about 0.1 angstroms per second (Å/s) to about 200 Å/s by changing the laser repetition rate from about 0.1 hertz (Hz) to about 200 Hz. Generally, the laser beam can have dimensions of about 3 millimeters (mm) by 4 mm with an average energy density of from about 1 to 4 joules per square centimeter ($J/cm^2$). After deposition, the films generally are cooled within an oxygen atmosphere of greater than about 100 Torr to room temperature.

Finally, where a subsequent layer of YBCO is deposited, it can generally be deposited by pulsed laser deposition at a thickness of, e.g., about 10,000 angstroms to 20,000 angstroms.

The present invention is more particularly described in the following examples which are intended as illustrative only, since numerous modifications and variations will be apparent to those skilled in the art.

EXAMPLE 1

A nickel alloy substrate (Hastelloy C276) was ultrasonically cleaned in soap and water, rinsed with deionized water, rinsed with methanol and blown dry with filtered nitrogen. A layer of aluminum oxide about 350 angstroms in thickness was deposited by ion beam sputter deposition. Onto this resultant article was deposited a layer of crystalline yttrium oxide (about 70 angstroms in thickness) also by ion beam sputter deposition.

An ion-assisted, electron beam evaporation system similar to that of Wang et al., App. Phys. Lett., v. 71, no. 20, pp. 2955-2957 (1997), was used to deposit a MgO film upon a flexible metal substrate of Hastelloy C-276 or other nickel-based alloys. The ion source was manufactured by Ion Tech, Inc. (Ft. Collins, Colo.) with a source geometry of 22 cm by 2.5 cm. The substrate normal to ion-assist beam angle was 45±3°. The ion source gas was argon. The ion source gas was introduced to a background partial pressure of about $1.0 \times 10^{-6}$ Torr with a total pressure during deposition of about $1 \times 10^{-4}$ Torr The electron gun heated the MgO source to maintain a deposition rate of about 0.15 nm/sec. The ion-assist gun voltage and current density were about 750 eV and 100 µA/cm² respectively.

Onto this resultant article was deposited a layer of MgO about 125 angstroms in thickness using ion beam assisted electron beam deposition with an ion assist gas of argon. Onto the IBAD-MgO layer was then deposited a layer of homoepitaxial MgO (about 300 angstroms in thickness) by magnetron sputtering. Onto the top MgO layer was deposited a layer of a mixture of strontium titanate and strontium ruthenate (50 atomic percent STO-50 atomic percent SRO) about 500 angstroms in thickness by pulsed laser deposition. Finally, a layer of YBCO about 1.4 microns in thickness was then deposited on the STO-SRO by pulsed laser deposition. The $J_c$ (at 75 K) was measured as $2.3 \times 10^6$ A/cm² using a standard four-point measurement. The projected $I_c$ is 320 Amperes across a sample 1 cm wide.

EXAMPLE 2

Additional nickel alloy substrates having similar coatings of aluminum oxide, yttrium oxide and magnesium oxide thereon were coated in the manner of Example 1 with various ratios of $SrTi_xRu_{1-x}O_3$ where $0<x\leq 1$. Onto these substrates, a layer of YBCO was coated in the manner of example 1. The resultant $J_c$'s were measured for the various substrates and the data is shown in FIG. 1. The data suggest a preferred strontium titanate (STO)-strontium ruthenate (SRO) ratio of about 50:50.

EXAMPLE 3

Nickel alloy substrates having similar coatings of aluminum oxide, yttrium oxide and magnesium oxide and $SrTi_xRu_{1-x}O_3$ where $0<x\leq 1$ were overcoated with a second buffer layer of cerium oxide by pulsed laser deposition. The resultant cerium oxide coatings were epitaxial in nature.

EXAMPLE 4

Figure 2:
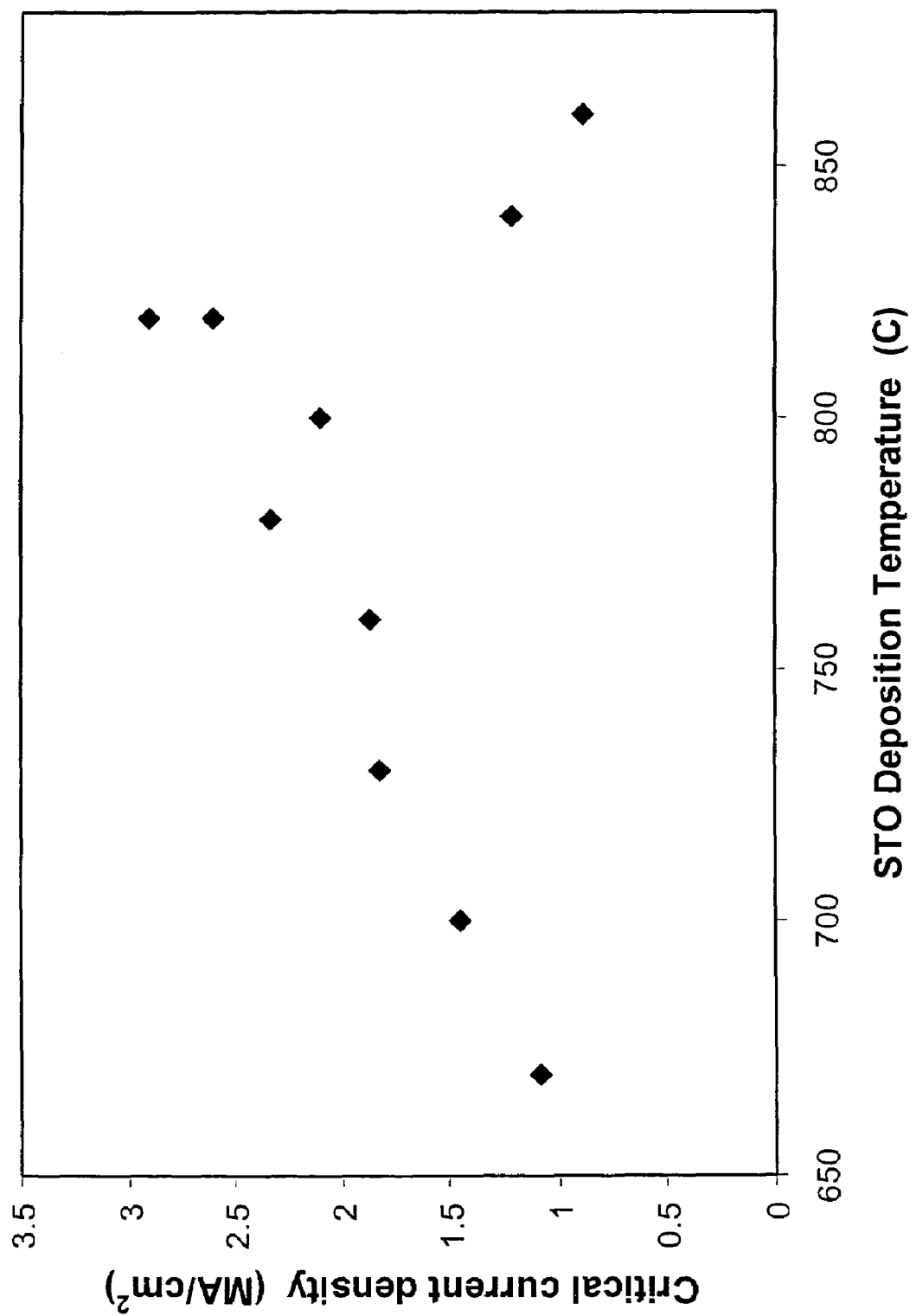
FIG. 2 shows a graph plotting critical current density (in $MA/cm^2$) for 1.5 micron thick YBCO coatings upon a strontium titanate ($SrTi_xRu_{1-x}O_3$ where $x=1$) buffer layer deposited at various temperatures.

Additional nickel alloy substrates having similar coatings of aluminum oxide, yttrium oxide and magnesium oxide thereon were coated in the manner of Example 1 with various ratios of $SrTi_xRu_{1-x}O_3$ where $x=1$ at various deposition temperatures. Onto these substrates, a layer of YBCO was coated in the manner of example 1. The resultant $J_c$'s were measured for the various deposition temperatures ($SrTiO_3$) and the data is shown in FIG. 2. The data suggest a preferred deposition temperature in the range of about 800° C. to about 825° C.

Although the present invention has been described with reference to specific details, it is not intended that such details should be regarded as limitations upon the scope of the invention, except as and to the extent that they are included in the accompanying claims.

What is claimed is:

1. A composite structure for subsequent growth of an epitaxial film layer thereon comprising:
    a base substrate; and,
    a buffer layer of a single phase $SrTi_xRu_{1-x}O_3$ where $0<x<1$ thereon, and in direct contact with, said base substrate.

2. The composite structure of claim 1 further including at least one layer of a second buffer material upon the layer of single phase $SrTi_xRu_{1-x}O_3$ where $0<x<1$.

3. The composite structure of claim 1 wherein said base substrate is of a material selected from the group consisting of polycrystalline metals, polycrystalline ceramics, single crystal lanthanum aluminum oxide, single crystal aluminum oxide, single crystal magnesium oxide, silica and glass.

4. The composite structure of claim 1 wherein said base substrate is of a material selected from the group consisting of polycrystalline ceramics, single crystal lanthanum aluminum oxide, single crystal aluminum oxide, single crystal magnesium oxide, silica and glass.

5. The composite structure of claim 1 where $x=0.5$.

6. A composite structure for subsequent growth of an epitaxial film layer thereon comprising:
    a base metallic substrate having a layer of magnesium oxide thereon, and in direct contact with, said base metallic substrate; and
    a buffer layer of a single phase $SrTi_xRu_{1-x}O_3$ where $0<x<1$ thereon, and in direct contact with, said layer of magnesium oxide.

7. The composite structure of claim 6 wherein said layer of magnesium oxide is deposited by ion-beam-assisted deposition.

8. The composite structure of claim 6 wherein said buffer layer is a mixture of strontium titanate and strontium ruthenate.

9. The composite structure of claim 6 further including at least one layer of a second buffer material upon the layer of $SrTi_xRu_{1-x}O_3$ where $0<x<1$.

10. The composite structure of claim 9 wherein the second buffer material is cerium oxide.

11. The composite structure of claim 6 wherein the epitaxial film layer is an epitaxial high temperature superconducting thin film.

12. The composite structure of claim 6 wherein $x=0.5$.

* * * * *